(12) United States Patent
Lee

(10) Patent No.: US 7,148,150 B2
(45) Date of Patent: Dec. 12, 2006

(54) METHOD OF FORMING METAL LINE LAYER IN SEMICONDUCTOR DEVICE

(75) Inventor: Joon Hyeon Lee, Cheongjoo-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 204 days.

(21) Appl. No.: 10/724,133

(22) Filed: Dec. 1, 2003

(65) Prior Publication Data

US 2005/0014381 A1    Jan. 20, 2005

(30) Foreign Application Priority Data

Jul. 18, 2003    (KR)    ............ 10-2003-0049249

(51) Int. Cl.
*H01L 21/461*    (2006.01)
*H01L 21/302*    (2006.01)

(52) U.S. Cl. .................. 438/714; 438/717; 438/720

(58) Field of Classification Search ........... 438/714, 438/717, 720
See application file for complete search history.

(56) References Cited

U.S. PATENT DOCUMENTS

| | | | |
|---|---|---|---|
| 6,012,469 A | 1/2000 | Li | |
| 6,013,574 A | 1/2000 | Hause et al. | |
| 6,063,695 A * | 5/2000 | Lin et al. | 438/462 |
| 6,117,345 A * | 9/2000 | Liu et al. | 216/19 |
| 6,177,353 B1 * | 1/2001 | Gutsche et al. | 438/704 |
| 6,232,209 B1 * | 5/2001 | Fujiwara et al. | 438/585 |
| 6,255,130 B1 | 7/2001 | Kim | |
| 6,342,452 B1 * | 1/2002 | Coronel et al. | 438/710 |
| 2002/0173160 A1 * | 11/2002 | Keil et al. | 438/717 |

* cited by examiner

*Primary Examiner*—Duy-Vu N Deo
(74) *Attorney, Agent, or Firm*—Mayer, Brown, Rowe and Maw LLP

(57) ABSTRACT

The present invention relates to a method of forming a metal line layer in a semiconductor device comprising step of depositing a metal line layer on a semiconductor structure; forming an insulating film and a photoresist material on the metal line layer in a sequential manner, patterning the metal line layer by using the photoresist material and the insulating film as a mask; removing the photoresist material; and etching the insulating film in an isotropic manner. According to the present invention, since metal polymers and metal residues are perfectly removed during the process of forming the metal line layer, it is possible to remove sources, which induce the bridge phenomena. Therefore, it is possible to remarkably improve reliability of a semiconductor device.

11 Claims, 3 Drawing Sheets

METHOD OF FORMING METAL LINE LAYER IN SEMICONDUCTOR DEVICE

BACKGROUND

1. Field of the Invention

The present invention relates to a method of forming a metal line layer in a semiconductor device and, more particularly to a method capable of reliably forming a metal line layer by depositing a metal line layer, depositing an insulating film as a hard mask, and then patterning the metal line layer.

2. Discussion of Related Art

Now, a conventional method of forming a metal line layer in a semiconductor device will be described in detail with reference to FIGS. 1A and 1B.

Referring to FIG. 1A, a metal line layer 110 is deposited on a lower oxide film (not shown). The metal line layer 110 may have a multi-layered structure. Then, a photoresist material 120 is deposited and then necessary portions are opened.

Referring to FIG. 1B, dry etching for the metal line layer 110 is dry-etched by using the patterned photoresist material 120 as a mask. However, the photoresist material 120 on the metal line layer 110 may be hardened to form metal polymers 130 during the dry etching process of the metal line layer 110. In practical processes, although these phenomena cannot be identified before the photoresist material 120 is perfectly removed, there are a lot of cases that the metal polymers 130 are not perfectly removed and remain on the metal line layer 110 even after removing the photoresist material 120. In addition, on top portions of the lower oxide film 140, which is exposed after completing the dry etching of the metal line layer, there may be metal residues 132, which induce bridge phenomena in the metal line layer 110.

Furthermore, during the patterning of the metal line layer 110, there may be a lot of losses of the photoresist material in the dry etching process for the metal line layer 110 due to poor selectivity for the photoresist material 120. This may cause attacks on the metal line layer 110 so that the patterns can be deteriorated. Particularly, this kind of problem can be serious to the case that the metal line layer 110 has a multi-layered metal structure including materials such as Ti/TiN.

Therefore, it is really necessary to prepare an effective method for ensuring reliability in the process of forming a metal line layer.

SUMMARY OF THE INVENTION

Accordingly, the present invention is contrived to solve the above problem and directed to ensure reliable conditions in the process of forming a metal line layer in a semiconductor device.

According to one aspect of the present invention, there is provided a method of forming a metal line layer in a semiconductor device, comprising the steps of: depositing a metal line layer on a semiconductor structure; forming an insulating film and a photoresist material on the metal line layer in a sequential manner; patterning the metal line layer by using the photoresist material and the insulating film as a mask; removing the photoresist material; and etching the insulating film in an isotropic manner.

In the aforementioned of a method of forming a metal line layer in a semiconductor device according to another embodiment of the present invention, the metal line layer may have a multi-layered structure including a Ti/TiN layer and an Al layer, preferably a first Ti/TiN layer, an Al layer, and a second Ti/TiN layer deposited in a sequential manner.

Preferably, the insulating film includes a nitride film, and a top layer in the semiconductor structure includes an oxide film.

In addition, the method may further comprise a step of forming a BARC layer between the insulating film and the photoresist material formation in order to prevent scattered reflection of light during the patterning of the photoresist material.

The BARC layer and the insulating film may be etched in a single step by using reactive plasma including $CHF_3/CF_4/Ar$ gases or $C_xF_y$ (where x and y are any natural number)/$O_2/Ar$ gases. Alternatively, the BARC layer may be etched in a dry manner by using reactive plasma including $O_2/N_2/Ar$ gases, and the nitride film may be etched in a dry manner by using reactive plasma including $CHF_3/CF_4/Ar$ gases or $C_xF_y$ (where x and y are any natural number)/$O_2/Ar$ gases.

Preferably, a down flow method using $O_2/CF_4$ gases may be adapted in the step of etching the insulating film.

Also, the method may further comprise a cleaning process in order to remove remaining metal polymers and/or metal residues after the step of etching the insulating film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
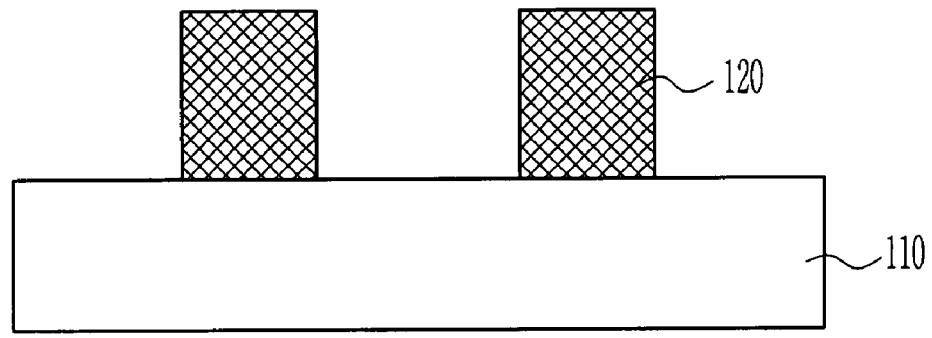
FIGS. 1A and 1B are cross-sectional views for explaining a conventional method of forming a metal line layer in a semiconductor device.
Figure 1B:
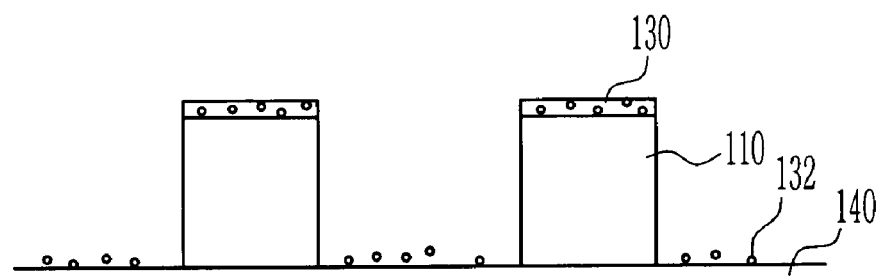

The present invention will be described in detail by way of the preferred embodiment with reference to the accompanying drawings, in which like reference numerals are used to identify the same or similar parts.

Now, a method of forming a metal line layer in a semiconductor device according to the preferred embodiment of the present invention will be described in detail with reference to FIGS. 2A to 2D.

Figure 2A:
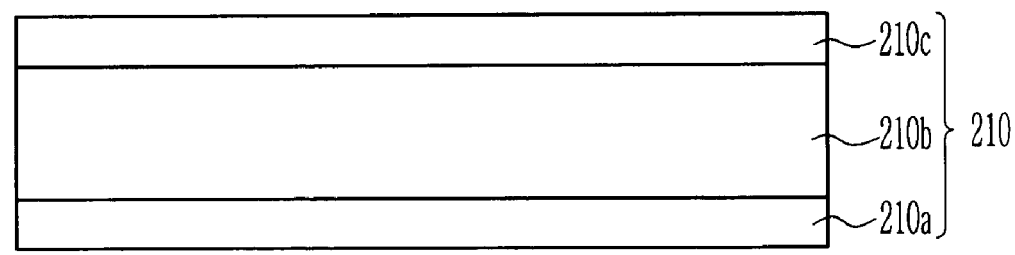
FIGS. 2A to 2D are cross-sectional views for explaining a method of forming a metal line layer in a semiconductor device according to a preferred embodiment of the present invention.

Referring to FIG. 2A, a metal line layer 210 is formed on a semiconductor structure (not shown) having a lower oxide film on top of it.

The "semiconductor structure" is a general term for the structure formed on a semiconductor substrate by patterning a variety of insulating films, conductive films, or the like used in a semiconductor process. Needless to say, contact plugs or the like may be formed in the semiconductor structure. The metal line layer 210 may comprise a fist Ti/TiN layer 210a, an Al layer 210b, and a second Ti/TiN layer 210c. In the first Ti/TiN film 210a, a Ti layer increases adhesive strength and a TiN layer functions as an antidiffusion film. The Al layer 210b is usually used to deliver electrical signals due to its low electrical resistance. In the second Ti/TiN film 210*a*, a Ti layer also increases adhesive strength and a TiN layer is used to absorb light and reduce reflection during the patterning of the photoresist material. The lower oxide film is not specifically limited by inter metal dielectric (IMD) or pre metal dielectric (PMD), and various kinds of materials can be adapted.

Figure 2B:
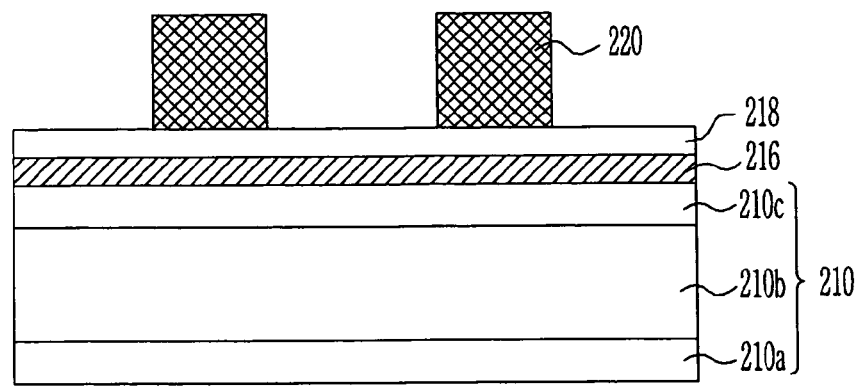

Referring to FIG. 2B, a nitride film 216 is deposited on the whole structure. Meanwhile, a bottom anti-reflection coating (BARC) layer 218 can be additionally deposited on top of the nitride film 216 so that reflection of light during the patterning of the photoresist material 220 can be reduced to allow the patterning to be performed with increased accuracy. FIG. 2B shows the situation that the BARC layer 218 is deposited on top of the nitride film 216.

Figure 2C:
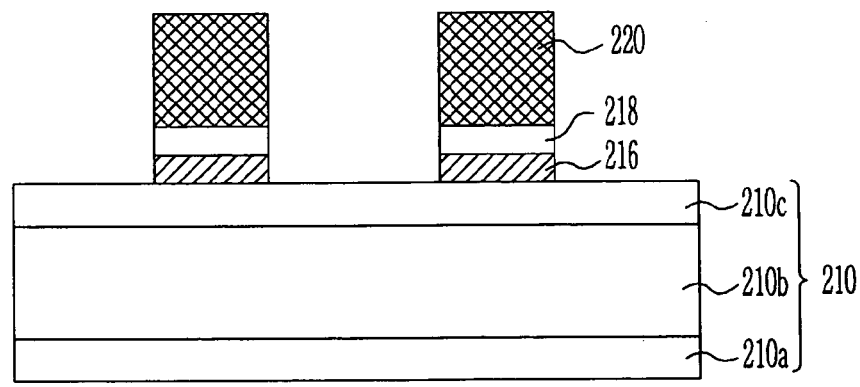

Referring to FIG. 2C, the photoresist material 220 patterned in predetermined portions is used as a mask to etch the BARC layer 218 and the nitride film 216. The BARC layer 218 and the nitride film 216 can be formed by dry etching in a single step. For the dry etching of the BARC layer 218, reactive plasma with gas combinations such as $CHF_3/CF_4/Ar$ can be used in a pre-etching process. For another example, gas combinations such as $C_xF_y$ (x and y are any natural number)/$O_2$/Ar can be used. In addition, reactive plasma with gas combinations such as $O_2/N_2$/Ar can be used in the dry etching of the BARC layer 218. When gas combinations of $CHF_3/F_4$ are used in the dry etching of the BARC layer 218, sufficient over-etching can be made so that the nitride film 216, which corresponds to a mask disposed under the BARC layer 218, can be also sufficiently etched even in a single step. However, when reactive plasma with gas combinations such as $O_2/N_2$/Ar is used in the dry etching, the nitride film that corresponds to a mask disposed under the BARC layer 218 may not be sufficiently etched. Therefore, it is preferable that an etching process for the nitride film 216 is additionally prepared in this case.

Figure 2D:
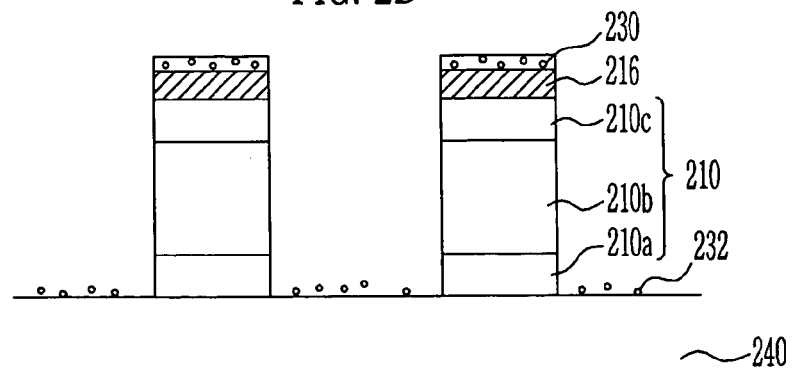

Referring to FIG. 2D, a photoresist material 220, a BARC layer 218, and a nitride film 216 are used as a mask to etch the metal line layer 210. Reactive plasma with gas combinations of $Cl_2/BCL_3/N_2$ is used to pattern the metal line layer 210. In this case, the photoresist material 220 on the metal line layer 210 may be hardened to form metal polymers 230 during the dry etching of the metal line layer 210. Although these phenomena cannot be identified before the photoresist material 220 is removed, the metal polymers 230 are not perfectly removed and remain on the metal line layer 210 even after removing the photoresist material 220. On the other hand, the BARC layer 218 also may be removed together during the removal of the photoresist material 220. In addition, on top of the lower oxide film 240 exposed after completing the dry etching of the metal line layer 210, there are metal residues 232, which cause metal bridge phenomena. Therefore, a process for removing the metal polymers 230 and the metal residues 232 is additionally performed after the patterning of the metal line layer 210 but before a cleaning process.

Now, a process of removing the metal polymers and the metal residues in a method of forming a metal line layer in a semiconductor device according to a preferred embodiment of the present invention will be described in detail with reference to FIGS. 3 to 4.

Figure 3:
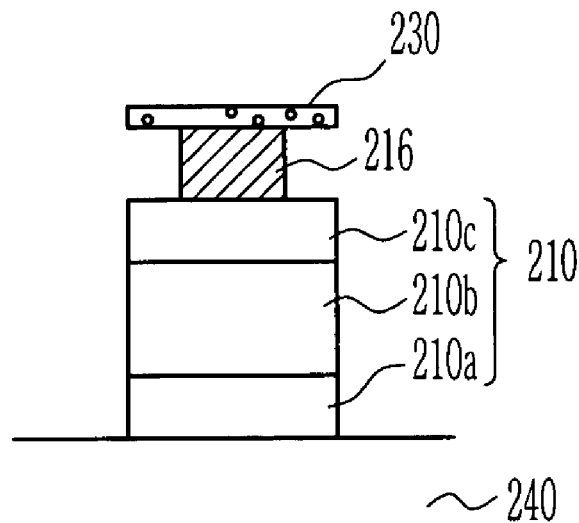
FIGS. 3 and 4 are cross-sectional views for explaining a process of removing metal polymers and metal residues in a method of forming a metal line layer in a semiconductor device according to a preferred embodiment of the present invention.

FIG. 3 is an enlarged view showing a part of the metal line layer 210 in FIG. 2D for explaining the situation that the metal residues 230 are removed. The nitride film 216, which corresponds to a hard mask, is etched by using a down flow method with $O_2/CF_4$ gases. Since the etching of the down flow method has an isotropic characteristic etching unlike the plasma etching, the nitride film 216 can be over-etched. In FIG. 3, the over-etched nitride film 216 is shown. Therefore, when the nitride film 216 is perfectly removed by using the aforementioned methods, the metal polymers 230 remaining on the nitride film 216 can be removed. However, since the metal polymers 230 partially remain in some cases, it may be necessary to additionally prepare a cleaning process for a perfect removal. In the cleaning process, de-ionized water, or LCT-935 or -928 (products of Ashland Inc.) can be used.

Figure 4:
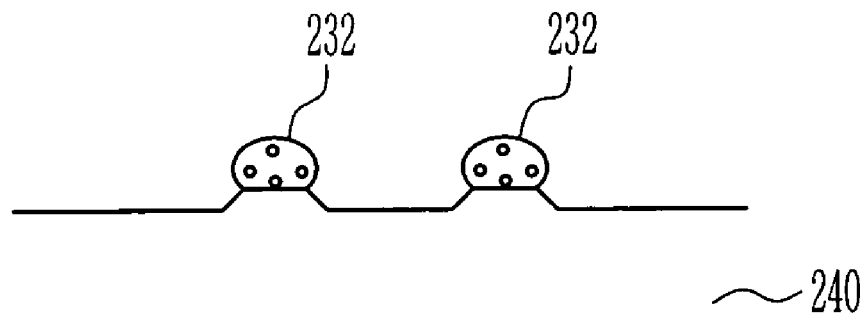

FIG. 4 is an enlarged view showing a part of the oxide film 240 in FIG. 2D for explaining the situation that the metal residues 232 are removed.

Specifically, this figure shows the situation that the metal residues 232 on the oxide film 240 are removed when the nitride film is removed by using the down flow method, in which the oxide film 240 is etched in a relatively small amount when the nitride film 216 on the metal line layer is removed due to an excellent selectivity (12:1) of the oxide film 240. As a result, although its etch rate is low, the metal residues 232 can be removed with a low loss of the nitride film 240 because isotropic etching can be made under the metal residues 232.

In the aforementioned configuration, if the height of the metal line becomes large, i.e., if the thickness of the metal line layer is calculated by including the deteriorated portions of the oxide film, the interlayer dielectric may not be filled easily so that voids can be created when the interlayer dielectric (not shown) is deposited in the subsequent process of forming metal lines. On the contrary, according to the present invention, since the dry etching for the metal line layer is performed by using a nitride film, which corresponds to a hard mask, it is possible to solve the problem related with poor selectivity for the photoresist material. Furthermore, the nitride film can be removed in a subsequent step to lower the height of the metal line layer. Also, the metal polymers and the metal residues can be removed.

In other words, since the metal polymers and the metal residues can be perfectly removed by the process of removing the nitride film after forming the metal line layer, there are no sources, which induce bridge phenomena. Therefore, it is possible to remarkably improve reliability of a semiconductor device.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a metal line layer in a semiconductor device, comprising the steps of:

depositing a metal line layer on a semiconductor structure;

forming an insulating film and a photoresist material pattern on the metal line layer in a sequential manner;

patterning the insulating film by using the patterned photoresist material;

patterning the metal line layer by using the photoresist material pattern and the patterned insulating film as a mask, wherein a metal polymer is formed on the patterned insulating film;

removing the photoresist material pattern; and removing the patterned insulating film from the metal line layer by an isotropic etching process so that the metal polymer is removed together with the patterned insulating film, thereby exposing a top surface of the metal line layer.

2. The method of forming a metal line layer in a semiconductor device according to claim 1, wherein the metal line layer has a multi-layered structure including a Ti/TiN layer and an Al layer.

3. The method of forming a metal line layer in a semiconductor device according to claim 2, wherein a first Ti/TiN layer, an Al layer, and a second Ti/TiN layer are sequentially deposited in the metal line layer.

4. The method of forming a metal line layer in a semiconductor device according to claim 1, wherein the insulating film includes a nitride film.

5. The method of forming a metal line layer in a semiconductor device according to claim 1, wherein a top layer in the semiconductor structure includes an oxide film.

6. The method of forming a metal line layer in a semiconductor device according to claim 1, wherein the method further comprises a step of forming a BARC layer between the insulating film and the photoresist material formation in order to prevent scattered reflection of light during the patterning of the photoresist material.

7. The method of forming a metal line layer in a semiconductor device according to claim 6, wherein the BARC layer and the insulating film are patterned in a single step by using reactive plasma including $CHF_3/CF_4/Ar$ gases.

8. The method of forming a metal line layer in a semiconductor device according to claim 6, wherein the BARC layer and the insulating film are patterned in a single step by using reactive plasma including $C_xF_y$ (where x and y are any natural number)/$O_2$/Ar gases.

9. The method of forming a metal line layer in a semiconductor device according to claim 6, wherein the BARC layer is patterned in a dry manner by using reactive plasma including $O_2N_2$/Ar gases, and the insulating film is patterned in a dry manner by using reactive plasma including $CHF_3/CF_4$/Ar gases or $C_xF_y$ (where x and y are any natural number)/$O_2$/Ar gases.

10. The method of forming a metal line layer in a semiconductor device according to claim 1, wherein $O_2/CF_4$ gases is used in the step of removing the insulating film.

11. The method of forming a metal line layer in a semiconductor device according to claim 1, wherein the method further comprises a cleaning process in order to remove remaining metal polymers and/or metal residues after the step of removing the insulating film.

* * * * *